(12) United States Patent
Inaba

(10) Patent No.: US 8,432,232 B2
(45) Date of Patent: Apr. 30, 2013

(54) MEMS DEVICE AND OSCILLATOR

(75) Inventor: Shogo Inaba, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/045,960

(22) Filed: Mar. 11, 2011

(65) Prior Publication Data

US 2011/0221536 A1   Sep. 15, 2011

(30) Foreign Application Priority Data

Mar. 12, 2010   (JP) ................................. 2010-055489

(51) Int. Cl.
*H03B 5/30* (2006.01)

(52) U.S. Cl.
USPC ................. 331/154; 331/116 R; 331/116 FE; 331/116 M; 331/156; 331/179; 331/177 R

(58) Field of Classification Search ............. 331/116 R, 331/116 FE, 116 M, 154, 156, 177 R, 179
See application file for complete search history.

(56) References Cited

U.S. PATENT DOCUMENTS

| | | | |
|---|---|---|---|
| 7,656,252 B2 | 2/2010 | Inaba et al. | |
| 7,696,587 B2 | 4/2010 | Watanabe et al. | |
| 7,709,912 B2 | 5/2010 | Sato et al. | |
| 7,880,245 B2 | 2/2011 | Sato et al. | |
| 7,884,431 B2 | 2/2011 | Watanabe et al. | |
| 7,906,439 B2 * | 3/2011 | Perruchot et al. ............. | 438/752 |
| 2007/0164632 A1 | 7/2007 | Adachi et al. | |
| 2008/0139946 A1 | 6/2008 | Adachi et al. | |
| 2008/0224241 A1 | 9/2008 | Inaba et al. | |
| 2009/0302707 A1 | 12/2009 | Inaba et al. | |
| 2010/0090786 A1 | 4/2010 | Inaba et al. | |
| 2011/0148537 A1 * | 6/2011 | Watanabe et al. ............. | 331/154 |

FOREIGN PATENT DOCUMENTS

| | | |
|---|---|---|
| JP | 2007-160495 | 6/2007 |
| JP | 2007-222956 | 9/2007 |
| JP | 2008-093812 | 4/2008 |
| JP | 2008-114354 | 5/2008 |
| JP | 2008-132583 | 6/2008 |
| JP | 2008-221435 | 9/2008 |
| JP | 2009-188785 | 8/2009 |
| JP | 2009-194934 | 8/2009 |

* cited by examiner

*Primary Examiner* — Arnold Kinkead
(74) *Attorney, Agent, or Firm* — Harness, Dickey & Pierce, P.L.C.

(57) ABSTRACT

A MEMS device includes a substrate, a cavity formed above the substrate, a first vibrator contained in the cavity, and a second vibrator contained in the cavity and having a natural frequency different from that of the first vibrator. The first vibrator and the second vibrator are preferably arranged along a long side of the cavity having a rectangular shape in plan view.

16 Claims, 8 Drawing Sheets

MEMS DEVICE AND OSCILLATOR

BACKGROUND

1. Technical Field

The present invention relates to a MEMS device and an oscillator.

2. Related Art

In recent years, MEMS devices manufactured using MEMS (Micro Electro Mechanical System) technology have attracted attention. Such MEMS devices have been utilized as vibrators or sensors. For example, JP-A-2007-222956 describes a MEMS device having a vibrator which is formed of a fixed electrode and a movable electrode formed on a semiconductor substrate using MEMS technology. In the MEMS device described in JP-A-2007-222956, the fixed electrode and the movable electrode are contained within a cavity sealed airtight under reduced pressure to reduce air resistance when the movable electrode vibrates.

Along with the miniaturization of electronic apparatuses in recent years, further miniaturization of such a MEMS device is required.

SUMMARY

An advantage of some aspects of the invention is to provide a MEMS device capable of achieving miniaturization. Another advantage of some aspects of the invention is to provide an oscillator including the MEMS device.

An aspect of the invention is directed to a MEMS device including: a substrate; a cavity formed above the substrate; a first vibrator contained in the cavity; and a second vibrator contained in the cavity.

According to the MEMS device, two vibrators (the first vibrator and the second vibrator) can be contained in one cavity. With this configuration, since the number of cavities can be reduced compared to a case where each of the two vibrators is contained in one cavity, that is, a case where two cavities are disposed, the occupied area of the cavity in the substrate can be reduced. Accordingly, miniaturization can be achieved.

It is noted that, in descriptions concerning the invention, the term "above" may be used, for example, in a manner as "a specific member (hereafter referred to as "B") formed "above" another specific member (hereafter referred to as "A"). In descriptions concerning the invention, the term "above" is used, in such an exemplary case described above, assuming that the use of the term includes a case of B formed directly on A, and a case of B formed above A through another member on A.

The MEMS device according to the aspect of the invention can be configured such that the cavity has, in plan view, a first side and a second side whose length is shorter than that of the first side, and that the first vibrator and the second vibrator are arranged, in plan view, along the first side.

According to the MEMS device, miniaturization can be achieved similarly to the above-described MEMS device.

The MEMS device according to the aspect of the invention can be configured such that the MEMS device further includes a third vibrator contained in the cavity, that the first vibrator and the second vibrator are arranged, in plan view, on a first imaginary straight line extending in a first direction, and that the third vibrator is arranged, in plan view, at a position where a second imaginary straight line extending in the first direction intersects a third imaginary straight line passing between the first vibrator and the second vibrator and extending in a second direction perpendicular to the first direction.

According to the MEMS device, the planar shape of the cavity can approach a square. Thus, for example, compared to a cavity having a planar shape in which the difference in length between a long side (the first side) and a short side (the second side) is great, deformation of coated layers (a first coated layer and a second coated layer) caused by the difference in coefficient of thermal expansion between the substrate and the coated layers can be suppressed. Therefore, it is possible to prevent blocking of the operation of the vibrators, or degradation of the characteristics of the vibrators due to an increase in pressure within the cavity, because of the deformation of the coated layers. Accordingly, a MEMS device with good characteristics and high reliability can be obtained.

Another aspect of the invention is directed to a MEMS device including: a substrate; a first electrode formed above the substrate; a second electrode having a first supporting portion formed above the substrate and a first beam portion extending from the first supporting portion in a first direction to face a part of the first electrode; a third electrode having a second supporting portion formed above the substrate and a second beam portion extending from the second supporting portion in a second direction opposite to the first direction to face a part of the first electrode; and a cavity formed above the substrate and containing the first electrode, the second electrode, and the third electrode, wherein the first electrode and the second electrode form a first vibrator, and the first electrode and the third electrode form a second vibrator.

According to the MEMS device, miniaturization can be achieved similarly to the above-described MEMS device.

Still another aspect of the invention is directed to a MEMS device including: a substrate; a first electrode formed above the substrate; a second electrode formed above the substrate; a third electrode formed between the first electrode and the second electrode above the substrate; a fourth electrode having a first supporting portion formed between the first electrode and the third electrode above the substrate, a first beam portion extended from the first supporting portion to face the first electrode, and a second beam portion extended from the first supporting portion to face apart of the third electrode; a fifth electrode having a second supporting portion formed between the second electrode and the third electrode above the substrate, a third beam portion extended from the second supporting portion to face a part of the third electrode, and a fourth beam portion extended from the second supporting portion to face the second electrode; and a cavity formed above the substrate and containing the first to fifth electrodes, wherein the first electrode and the first beam portion form a first vibrator, the third electrode and the second beam portion form a second vibrator, the third electrode and the third beam portion form a third vibrator, and the fourth electrode and the fourth beam portion form a fourth vibrator.

According to the MEMS device, miniaturization can be achieved similarly to the above-described MEMS device.

The MEMS device according to the aspect of the invention can be configured such that the MEMS device further includes an insulating portion formed above the substrate, and that the cavity is disposed in the insulating portion.

The MEMS device according to the aspect of the invention can be configured such that the insulating portion is formed of a plurality of inter-layer insulating layers.

The MEMS device according to the aspect of the invention can be configured such that a guard ring surrounding the cavity in plan view is formed above the substrate.

The MEMS device according to the aspect of the invention can be configured such that the guard ring is formed of a conductive material.

According to the MEMS device, a guard ring can function as an electromagnetic shield.

Further another aspect of the invention is directed to an oscillator including the MEMS device according to the aspect of the invention.

According to the oscillator, an oscillator having a desired resonant frequency can be obtained at high yield.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the drawings.

1. First Embodiment 1.1. MEMS device

Figure 1:
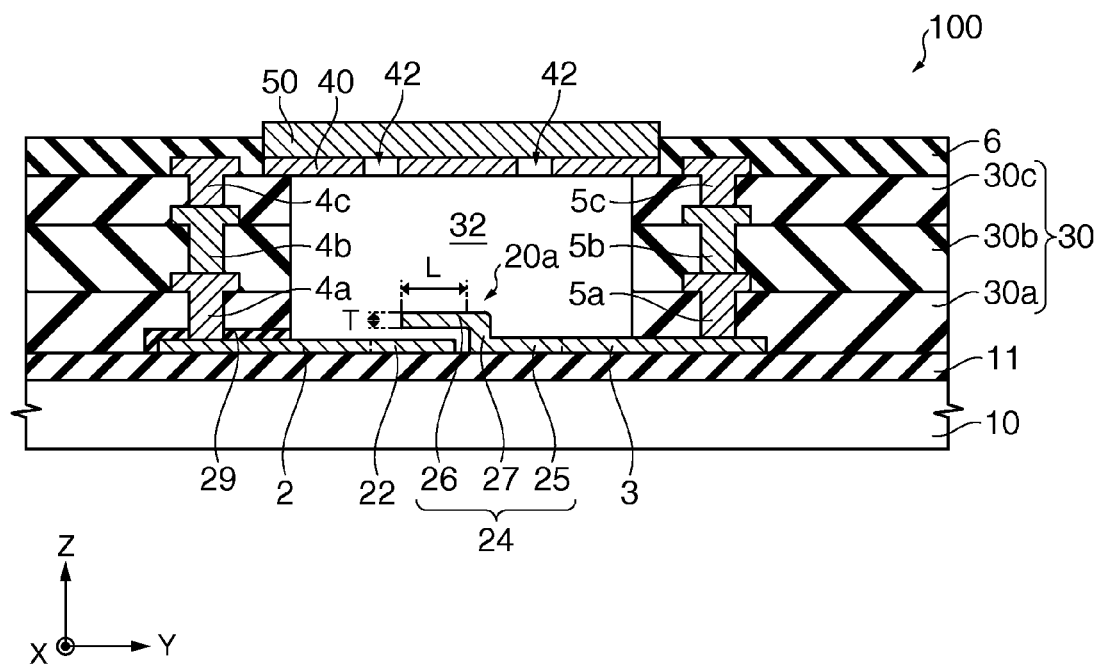
FIG. 1 is a cross-sectional view schematically showing a MEMS device according to a first embodiment.
Figure 2:
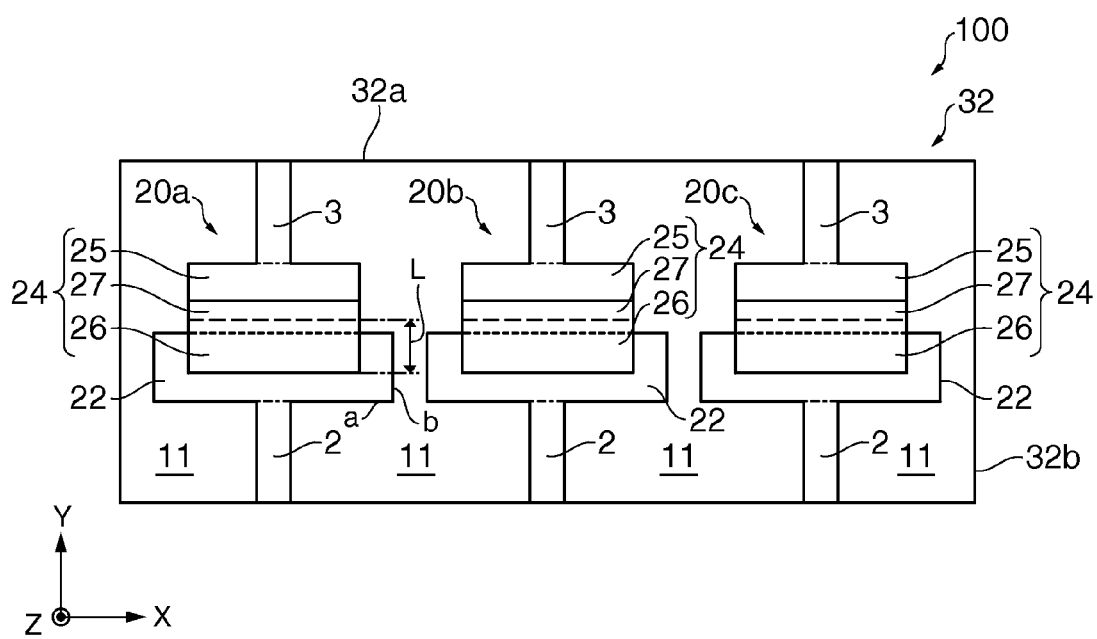
FIG. 2 is a plan view schematically showing the interior of a cavity of the MEMS device according to the first embodiment.

A MEMS device according to a first embodiment will be first described with reference to the drawings. FIG. 1 is a cross-sectional view schematically showing the MEMS device 100 according to the embodiment. FIG. 2 is a plan view schematically showing the interior of a cavity 32 of the MEMS device 100 shown in FIG. 1.

As shown in FIGS. 1 and 2, the MEMS device 100 includes a substrate 10, vibrators (a first vibrator 20a, a second vibrator 20b, and a third vibrator 20c), and an insulating portion (hereinafter referred to as an inter-layer insulating layer) 30. The MEMS device 100 can further include a first coated layer 40 and a second coated layer 50.

As the substrate 10, for example, a semiconductor substrate such as a silicon substrate can be used. As the substrate 10, various kinds of substrates such as a ceramics substrate, a glass substrate, a sapphire substrate, or a synthetic resin substrate may be used. An under layer 11 is formed on the substrate 10. The under layer 11 has a stacked structure in which, for example, a silicon oxide layer and a silicon nitride layer are stacked in this order from the substrate 10 side.

The inter-layer insulating layer 30 is formed on the under layer 11. The inter-layer insulating layer 30 is composed of three layers, a first inter-layer insulating layer 30a, a second inter-layer insulating layer 30b, and a third inter-layer insulating layer 30c, in the illustrated example. However, the number of layers constituting the inter-layer insulating layer 30 is not especially limited thereto. On the inter-layer insulating layer 30, a protective film 6 formed of silicon oxide or silicon nitride is formed.

The inter-layer insulating layer 30 has the cavity 32 in which the vibrators 20a, 20b, and 20c are contained. Although the three vibrators 20a, 20b, and 20c are contained in the cavity 32 as shown in FIG. 2, the number of vibrators is not limited thereto. As shown in FIG. 2, the cavity 32 has, in plan view (viewed from the Z-direction), first sides 32a and second sides 32b whose length is shorter than that of the first side 32a. In the illustrated example, the first side 32a extends in the X-direction, and the second side 32b extends in the Y-direction. Although the planar shape of the cavity 32 is a rectangle whose first side 32a is a long side and whose second side 32b is a short side, the shape of the cavity is not especially limited thereto.

The interior of the cavity 32 is under reduced pressure, for example. In the illustrated example, the cavity 32 is a region defined by side surfaces of the inter-layer insulating layer 30, the first coated layer 40, and the substrate 10 (the under layer 11). Although not shown in the drawing, a surrounding wall (guard ring) which surrounds the vibrators 20a, 20b, and 20c in plan view may be formed in the cavity 32. The surrounding wall can be formed in a common step with interconnect plugs 4a, 4b, 4c, 5a, 5b, and 5c. By forming the surrounding wall with a conductive material, the surrounding wall can function as an electromagnetic shield.

The first vibrator 20a, the second vibrator 20b, and the third vibrator 20c are contained within the cavity 32. As shown in FIG. 2, the first vibrator 20a, the second vibrator 20b, and the third vibrator 20c are arranged, in plan view, along the first side 32a (X-direction) as a long side. Each of the vibrators 20a, 20b, and 20c is arranged such that, for example, long sides a of a fixed electrode 22 are parallel with the first side 32a.

Each of the vibrators 20a, 20b, and 20c has the fixed electrode 22 formed on the under layer 11 and a movable electrode 24 formed with a given gap between the movable electrode and the fixed electrode 22. The planar shape of the fixed electrode 22 is a rectangle having the long sides a and short sides b as shown in FIG. 2. The movable electrode 24 is composed of a fixed portion 25 formed on the under layer 11, a vibratable beam portion 26 arranged to face the fixed electrode 22, and a supporting portion 27 supportingly coupling the beam portion 26 with the fixed portion 25. The movable electrode 24 is cantilevered in the illustrated example, but may be clamped at both ends. When voltage is applied between the electrodes 22 and 24 from an external oscillator circuit unit (for example, an oscillator circuit unit 110 shown in FIG. 13), the movable electrode 24 vibrates due to an electrostatic force generated between the electrodes 22 and 24. Examples of the materials of the fixed electrode 22 and the movable electrode 24 include, for example, polycrystalline silicon doped with a predetermined impurity to provide conductivity.

The first to third vibrators 20a, 20b, and 20c have natural frequencies different from one another, for example. For example, the first to third vibrators 20a, 20b, and 20c have the movable electrodes 24 different in shape from one another, thereby being capable of having natural frequencies different from one another. Specifically, the beam portions 26 of the vibrators 20a, 20b, and 20c are made different in length L or film thickness T (refer to FIG. 1) from one another, whereby the vibrators 20a, 20b, and 20c can have natural frequencies different from one another.

The fixed electrode 22 is electrically connected with a wire 2 within the cavity 32 and is electrically connected through the wire 2 with the interconnect plug 4a formed outside the cavity 32. As shown in FIG. 2, the wire 2 extends, in plan view, from the fixed electrode 22 along the second side 32b of the cavity 32 in the −Y-direction. The fixed electrode 22 is electrically connected with an external oscillator circuit unit through, for example, the wire 2, the interconnect plugs 4a, 4b, and 4c, and the like.

The movable electrode 24 is electrically connected with a wire 3 within the cavity 32 and is electrically connected through the wire 3 with the interconnect plug 5a formed outside the cavity 32. The wire 3 extends, in plan view, from the movable electrode 24 along the second side 32b of the cavity 32 in a direction (+Y-direction) opposite to the direction (−Y-direction) in which the wire 2 extends. The movable electrode 24 is electrically connected with an external oscillator circuit unit through, for example, the wire 3, the interconnect plugs 5a, 5b, and 5c, and the like.

As shown in FIG. 1, the first coated layer 40 is formed above the cavity 32. In the first coated layer 40, through holes 42 are formed. The number of through holes 42 is two in the example of FIG. 1. However, the number of through holes is not limited thereto. The first coated layer 40 covers the top of the cavity 32. The first coated layer 40 has a stacked structure in which, for example, a titanium layer, a titanium nitride layer, an aluminum-copper alloy layer, and a titanium nitride layer are stacked in this order. The film thickness of the first coated layer 40 is, for example, about several hundreds nm.

The second coated layer 50 is formed on the first coated layer 40. The second coated layer 50 covers the through holes 42 of the first coated layer 40. The first coated layer 40 and the second coated layer 50 are sealing members which cover the top of the cavity 32 to seal the cavity 32. Examples of the material of the second coated layer 50 include, for example, metal such as aluminum, titanium, or tungsten. The film thickness of the second coated layer 50 is, for example, about 3 μm.

The MEMS device 100 has the following features, for example.

According to the MEMS device 100, the plurality of vibrators 20a, 20b, and 20c can be contained in one cavity 32. Accordingly, since the number of cavities can be reduced compared to a case where each of a plurality of vibrators is contained in one cavity, that is, a case where a plurality of cavities are disposed, the occupied area of the cavity 32 on the substrate 10 can be reduced. According to the MEMS device 100, therefore, miniaturization can be achieved.

The MEMS device 100 can have the plurality of vibrators 20a, 20b, and 20c different in natural frequencies. Accordingly, for example, a plurality of frequency signals can be output from one MEMS device 100. Moreover, for example, a vibrator from which a resonant frequency close to a desired resonant frequency can be obtained is selected from the plurality of vibrators 20a, 20b, and 20c for use, whereby an oscillator having a desired resonant frequency can be obtained at high yield. Further, the plurality of vibrators 20a, 20b, and 20c are contained in one cavity 32, so that the characteristics of the plurality of vibrators 20a, 20b, and 20c can be compared under a situation where the magnitude of the reduced pressure within the cavity is identical. Detailed description will be made later.

1.2. Method for Manufacturing MEMS Device

Next, a method for manufacturing the MEMS device 100 according to the embodiment will be described with reference to the drawings. FIGS. 3 to 6 are cross-sectional views schematically showing the manufacturing steps of the MEMS device 100.

Figure 3:
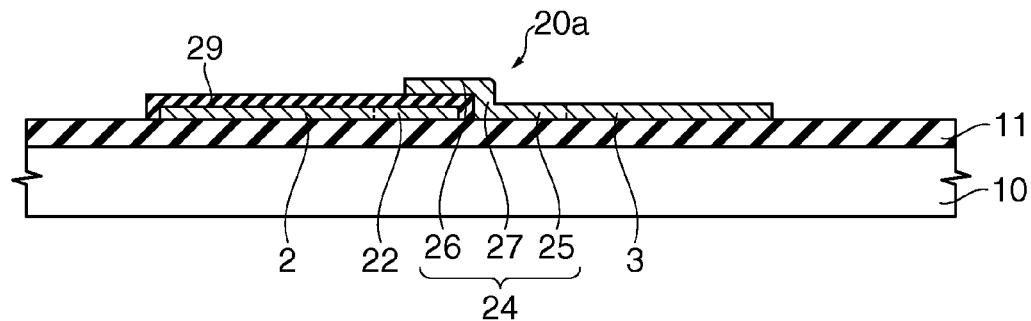
FIG. 3 is a cross-sectional view schematically showing a manufacturing step of the MEMS device according to the first embodiment.

As shown in FIG. 3, the vibrators 20a, 20b, and 20c are formed on the under layer 11. In FIG. 3, although only the first vibrator 20a is illustrated, the second vibrator 20b and the third vibrator 20c can also be formed in the same step. In the step for forming the vibrators 20a, 20b, and 20c, specifically, the fixed electrode 22 is first formed on the under layer 11 by a deposition process using a CVD method, a sputtering method, or the like and by a patterning process using a photolithographic technique. When the fixed electrode 22 is formed of polycrystalline silicon, polycrystalline silicon is doped with a predetermined impurity to provide conductivity. Next, a sacrificial layer 29 covering the fixed electrode 22 is formed by a thermal oxidation process or a CVD method. As the sacrificial layer, for example, an oxide film can be used. Next, the movable electrode 24 is formed on the sacrificial layer 29 and on the under layer 11. The movable electrode 24 is formed by a deposition process using a CVD method or a sputtering method and by a patterning process using a photolithographic technique. When the movable electrode 24 is formed of polycrystalline silicon, polycrystalline silicon is doped with a predetermined impurity to provide conductivity. Through the above-described step, the vibrators 20a, 20b, and 20c are formed. In the step, the wire 2 and the wire 3 are formed integrally with the fixed electrode 22 or the movable electrode 24.

Figure 4:
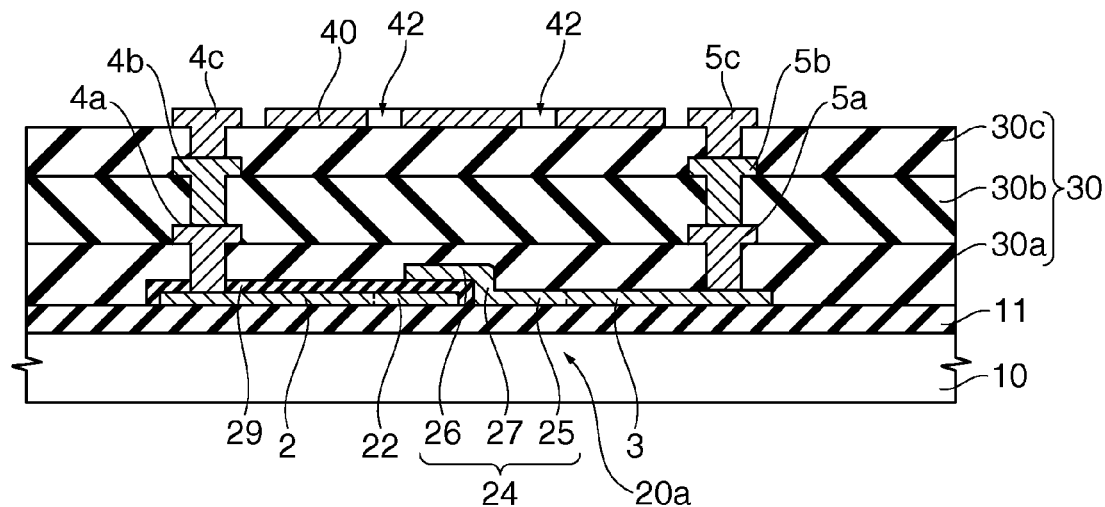
FIG. 4 is a cross-sectional view schematically showing a manufacturing step of the MEMS device according to the first embodiment.

As shown in FIG. 4, the inter-layer insulating layer covering the vibrators 20a, 20b, and 20c, and the interconnect plugs 4a, 4b, 4c, 5a, 5b, and 5c formed in the inter-layer insulating layer 30 are formed. The inter-layer insulating layer 30 is formed by, for example, a CVD method, a coating (spin coat) method, or the like. After forming the inter-layer insulating layer 30, the surface of the inter-layer insulating layer 30 may be planarized. The interconnect plugs 4a, 4b, 4c, 5a, 5b, and 5c are formed by a deposition process using a CVD method, a sputtering method, or the like and by a patterning process using a photolithographic technique. In the step for forming the interconnect plugs 4a, 4b, 4c, 5a, 5b, and 5c, a surrounding wall (not illustrated) which surrounds the vibrators 20a, 20b, and 20c may be formed.

Next, the first coated layer 40 is formed on the inter-layer insulating layer 30 above the vibrators 20a, 20b, and 20c. The first coated layer 40 is formed by, for example, a deposition process using a sputtering method, a CVD method, or the like and by a patterning process using a photolithographic technique. In the first coated layer 40, the through holes 42 are formed. The through hole 42 may be formed by the patterning process in the step, or may be formed by a patterning process after forming the first coated layer 40.

Figure 5:
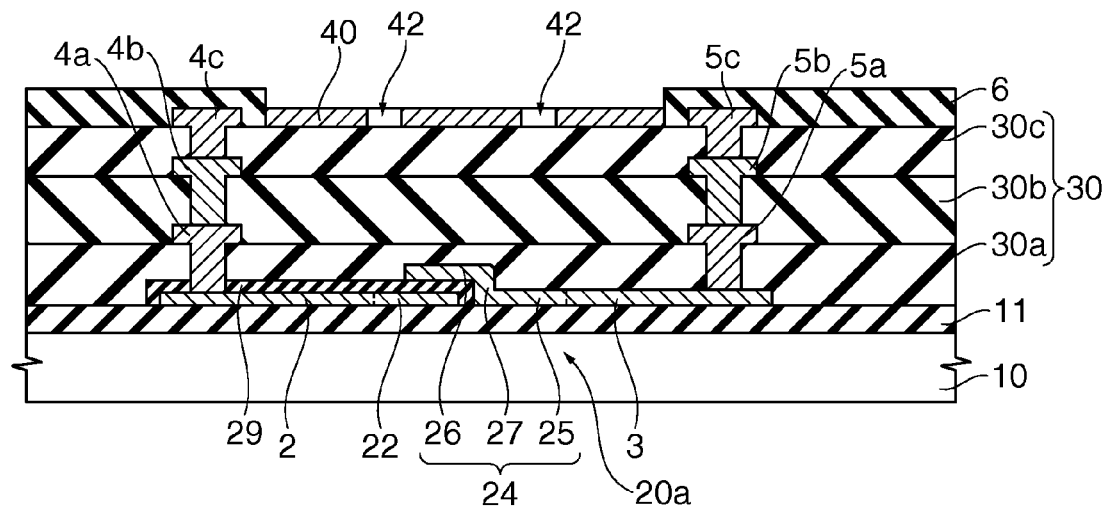
FIG. 5 is a cross-sectional view schematically showing a manufacturing step of the MEMS device according to the first embodiment.

As shown in FIG. 5, the protective film 6 is formed on the inter-layer insulating layer 30 and on the interconnect plugs 4c and 5c. The protective film 6 is formed by, for example, a plasma CVD method. Next, an opening in communication with the through holes 42 is formed in the protective film 6. That is, the through holes 42 are exposed through the opening. The opening is formed by, for example, a photolithographic technique.

Figure 6:
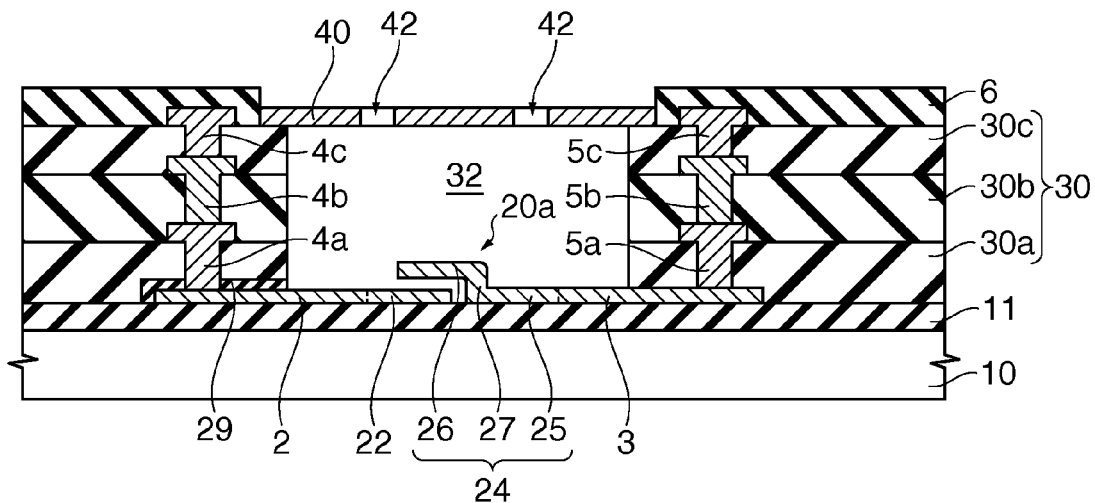
FIG. 6 is a cross-sectional view schematically showing a manufacturing step of the MEMS device according to the first embodiment.

As shown in FIG. 6, the inter-layer insulating layer 30 and the sacrificial layer 29 above the vibrators 20a, 20b, and 20c are removed through the through holes 42 to form the cavity 32 (release step). For example, the inter-layer insulating layer 30 and the sacrificial layer 29 can be removed by wet etching using hydrofluoric acid or buffered hydrofluoric acid (a mixed liquid of hydrofluoric acid and ammonium fluoride), or by dry etching using hydrogen fluoride gas or the like, to form the cavity 32.

As shown in FIG. 1, the second coated layer 50 is formed on the first coated layer 40. The second coated layer 50 is formed on at least the through holes 42 of the first coated layer 40. Thus, the through holes 42 can be covered, and therefore, the cavity 32 can be sealed. The second coated layer 50 can be formed by, for example, a vapor deposition method such as a sputtering method or a CVD method. This makes it possible to seal the cavity 32 while the reduced pressure is maintained.

Through the above-described steps, the MEMS device 100 can be manufactured.

According to the method for manufacturing the MEMS device 100, the plurality of vibrators 20a, 20b, and 20c can be contained in one cavity 32.

1.3. Modified Examples

Next, MEMS devices according to modified examples of the embodiment will be described with reference to the drawings. Hereinafter, in the MEMS devices according to the modified examples of the embodiment, members having the same functions as those of the constituent members of the MEMS device 100 are denoted by the same reference numerals and signs, and the detailed descriptions thereof are omitted.

1.3.1 First Modified Example

Figure 7:
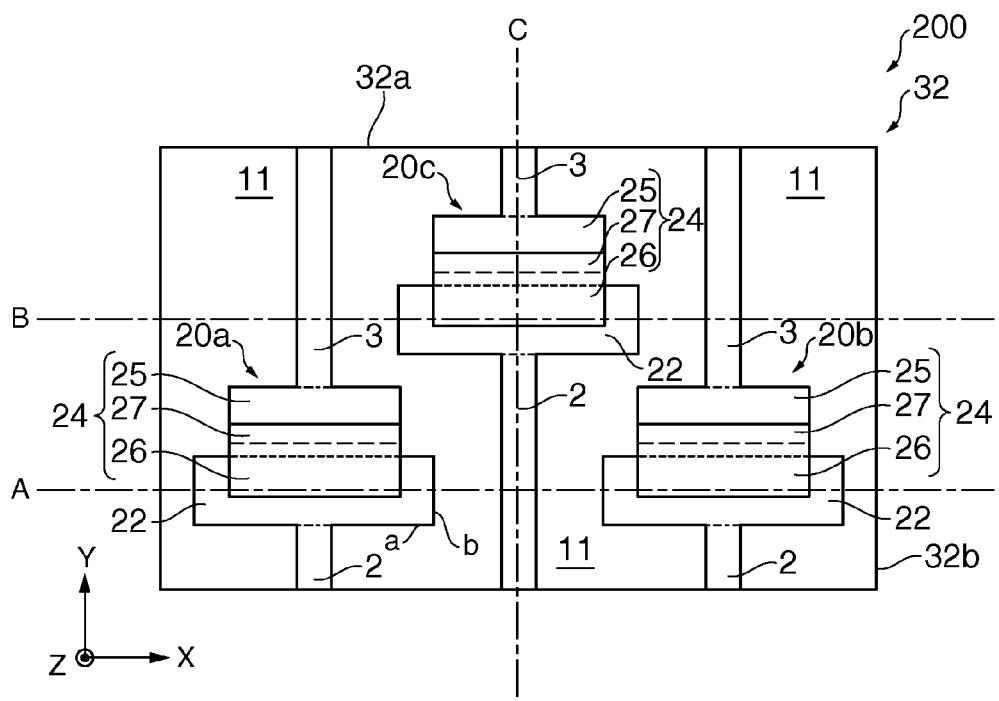
FIG. 7 is a plan view schematically showing the interior of a cavity of a MEMS device according to a first modified example of the first embodiment.

First, a MEMS device 200 according to a first modified example of the embodiment will be described. FIG. 7 is a plan view schematically showing the interior of the cavity 32 of the MEMS device 200.

In the MEMS device 200 as shown in FIG. 7, the first vibrator 20a, the second vibrator 20b, and the third vibrator 20c are contained within one cavity 32. The first vibrator 20a and the second vibrator 20b are arranged, in plan view, on a first imaginary straight line A extending in a first direction (X-direction in the illustrated example). In the illustrated example, the first direction is a direction along the first side 32a of the cavity 32. The third vibrator 20c is arranged, in plan view, at a position where a second imaginary straight line B extending in the first direction intersects a third imaginary straight line C passing between the first vibrator 20a and the second vibrator 20b and extending in a second direction (Y-direction in the illustrated example) perpendicular to the first direction. With this configuration, compared to a case where a plurality of vibrators are arranged, in plan view, on one imaginary straight line (for example, refer to FIG. 2), the difference in length between the first side 32a and the second side 32b of the cavity 32 can be reduced. That is, the planar shape of the cavity 32 can approach a square.

In the illustrated example, the first to third vibrators 20a, 20b, and 20c are contained within the cavity 32. However, by repeating the above-described arrangement pattern including the first to third vibrators 20a, 20b, and 20c, four or more vibrators may be contained within the cavity 32.

According to the MEMS device 200, the planar shape of the cavity 32 can approach a square. Thus, for example, compared to a cavity having a planar shape in which the difference in length between a long side (the first side 32a) and a short side (the second side 32b) is great, deformation of the coated layers 40 and 50 caused by the difference in coefficient of thermal expansion between the substrate 10 and the coated layers 40 and 50 can be suppressed. Therefore, it is possible to prevent blocking of the operation of the vibrators 20a, 20b, and 20c, or degradation of the characteristics of the vibrators 20a, 20b, and 20c due to an increase in pressure within the cavity 32, because of the deformation of the coated layers 40 and 50. Accordingly, a MEMS device with good characteristics and high reliability can be obtained.

According to the MEMS device 200, the plurality of vibrators 20a, 20b, and 20c can be contained in one cavity 32. Accordingly, the MEMS device 200 can provide a similar advantageous effect to that of the MEMS device 100.

1.3.2 Second Modified Example

Figure 8:
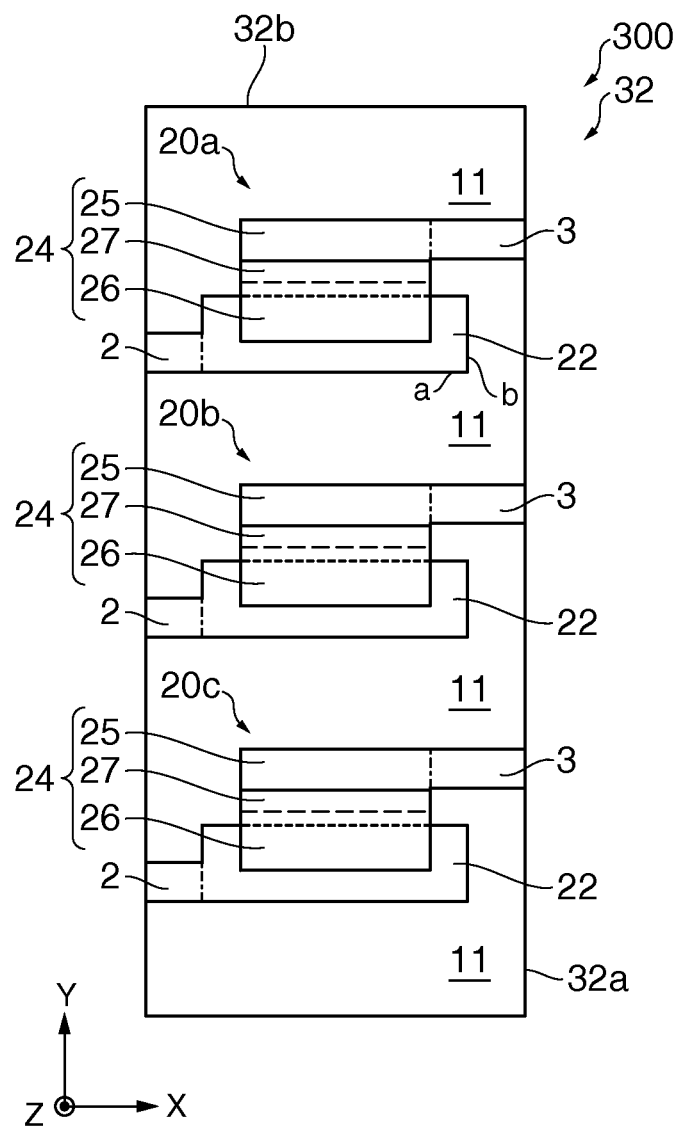
FIG. 8 is a plan view schematically showing the interior of a cavity of a MEMS device according to a second modified example of the first embodiment.

Next, a MEMS device 300 according to a second modified example of the embodiment will be described. FIG. 8 is a plan view schematically showing the interior of the cavity 32 of the MEMS device 300.

In the MEMS device 300, the first vibrator 20a, the second vibrator 20b, and the third vibrator 20c are arranged, in plan view, along the first side 32a as a long side, as shown in FIG. 8. That is, the vibrators 20a, 20b, and 20c are arranged so as to be aligned in the Y-direction in the illustrated example. Each of the vibrators 20a, 20b, and 20c is arranged such that the short side b of the fixed electrode 22 is parallel with the first side 32a of the cavity 32.

The wire 2 to be connected with the fixed electrode 22 extends, in plan view, from the fixed electrode 22 in the −X-direction. The wire 3 to be connected with the movable electrode 24 extends from the movable electrode 24 in a direction (+X-direction) opposite to the direction (−X-direction) in which the wire 2 extends.

According to the MEMS device 300, the plurality of vibrators 20a, 20b, and 20c can be contained in one cavity 32. Accordingly, the MEMS device 300 can provide a similar advantageous effect to that of the MEMS device 100.

2. Second Embodiment

Figure 9:
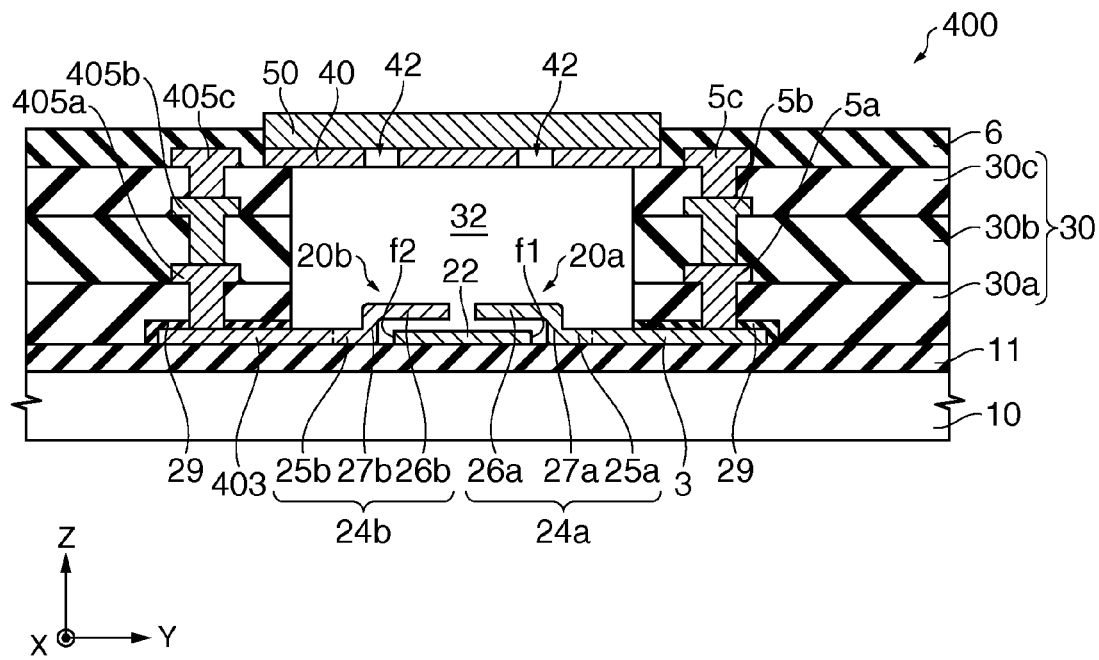
FIG. 9 is a cross-sectional view schematically showing a MEMS device according to a second embodiment.
Figure 10:
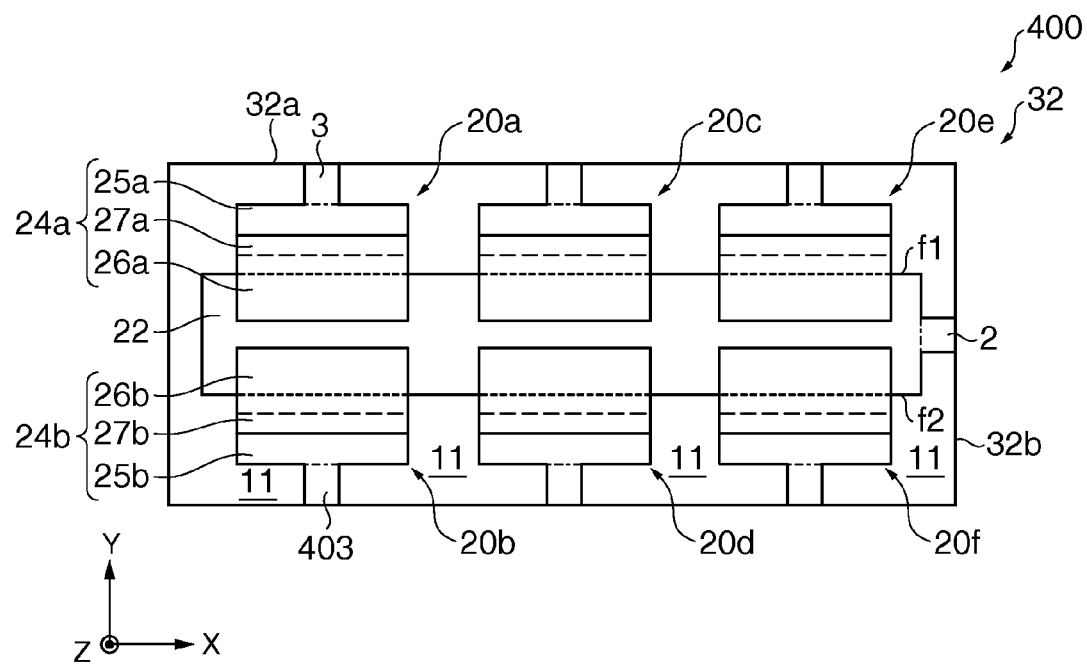
FIG. 10 is a plan view schematically showing the interior of a cavity of the MEMS device according to the second embodiment.

Next, a MEMS device 400 according to a second embodiment will be described with reference to the drawings. FIG. 9 is a cross-sectional view schematically showing the MEMS device 400. FIG. 10 is a plan view schematically showing the interior of the cavity 32 of the MEMS device 400 shown in FIG. 9. In the MEMS device 400 according to the second embodiment, members having the same functions as those of the MEMS device 100 according to the first embodiment are denoted by the same reference numerals and signs, and the detailed descriptions thereof are omitted.

As shown in FIGS. 9 and 10, the MEMS device 400 includes the substrate 10, vibrators (the first vibrator 20a, the second vibrator 20b, the third vibrator 20c, a fourth vibrator 20d, a fifth vibrator 20e, and a sixth vibrator 20f), and the inter-layer insulating layer 30. The MEMS device 400 can further include the first coated layer 40 and the second coated layer 50.

The first vibrator 20a has a first electrode (hereinafter referred to as a fixed electrode in the embodiment) 22 and a second electrode (hereinafter referred to as a first movable electrode in the embodiment) 24a. The first movable electrode 24a is composed of a first supporting portion 27a formed on the under layer 11, a first beam portion 26a extending from the first supporting portion 27a in the first direction (−Y-direction in the illustrated example) to face the fixed electrode 22, and a first fixed portion 25a formed on the under layer 11 and being continuous with the first supporting portion 27a. The fixed electrode 22 and the first movable electrode 24a are contained within the cavity 32.

The first movable electrode 24a is electrically connected with the wire 3 within the cavity 32 and is electrically connected through the wire 3 with the interconnect plug 5a formed outside the cavity 32. The first movable electrode 24a is electrically connected with an external oscillator circuit unit (for example, the oscillator circuit unit 110 shown in FIG. 13) through, for example, the wire 3, the interconnect plugs 5a, 5b, and 5c, and the like.

As shown in FIG. 10, the third vibrator 20c and the fifth vibrator 20e each have the same configuration as that of the first vibrator 20a.

The second vibrator 20b has the fixed electrode 22 and a third electrode (hereinafter referred to as a second movable electrode in the embodiment) 24b. The second movable electrode 24b is composed of a second supporting portion 27b formed on the under layer 11, a second beam portion 26b extending from the second supporting portion 27b in the second direction (+Y-direction in the illustrated example) opposite to the first direction to face the fixed electrode 22, and a second fixed portion 25b formed on the under layer 11 and being continuous with the second supporting portion 27b. A region of the fixed electrode 22 facing the first beam portion 26a and a region of the fixed electrode 22 facing the second beam portion 26b do not overlap in the illustrated example. The second movable electrode 24b is contained within the cavity 32.

The second movable electrode 24b is electrically connected with a wire 403 within the cavity 32 and is electrically connected through the wire 403 with an interconnect plug 405a formed outside the cavity 32. The second movable electrode 24b is electrically connected with an external oscillator circuit unit through, for example, the wire 403, the interconnect plug 405a, interconnect plugs 405b and 405c, and the like.

As shown in FIG. 10, the fourth vibrator 20d and the sixth vibrator 20f each have the same configuration as that of the second vibrator 20b.

The fixed electrode 22 is a common electrode of the first to sixth vibrators 20a, 20b, 20c, 20d, 20e, and 20f. As shown in FIG. 10, the first vibrator 20a and the second vibrator 20b are arranged so as to be aligned in the Y-direction with the fixed electrode 22 therebetween. The third vibrator 20c and the fourth vibrator 20d are arranged so as to be aligned in the Y-direction with the fixed electrode 22 therebetween. The fifth vibrator 20e and the sixth vibrator 20f are arranged so as to be aligned in the Y-direction with the fixed electrode 22 therebetween. As shown in FIG. 10, the planar shape of the fixed electrode 22 is, for example, a rectangle. The fixed electrode 22 has a first side surface f1 and a second side surface f2 which face each other. The first beam portion 26a of the first movable electrode 24a extends from the first side surface f1 side to the second side surface f2 side to face a part of the fixed electrode 22. The second beam portion 26b of the second movable electrode 24b extends from the second side surface f2 side to the first side surface f1 side to face a part of the fixed electrode 22.

The first to sixth vibrators 20a, 20b, 20c, 20d, 20e, and 20f have natural frequencies different from one another, for example. For example, the first to sixth vibrators 20a, 20b, 20c, 20d, 20e, and 20f have the movable electrodes 24a and 24b different in shape from one another, thereby being capable of having natural frequencies different from one another.

According to the MEMS device 400, the fixed electrode 22 is a common electrode of the first to sixth vibrators 20a, 20b, 20c, 20d, 20e, and 20f. Accordingly, the routing of the wire 2 which electrically connects the fixed electrode 22 with the interconnect plugs (not illustrated) formed outside the cavity 32 can be simplified.

According to the MEMS device 400, the plurality of vibrators 20a, 20b, 20c, 20d, 20e, and 20f can be contained in one cavity 32. Accordingly, the MEMS device 400 can provide a similar advantageous effect to that of the MEMS device 100.

3. Third Embodiment

Figure 11:
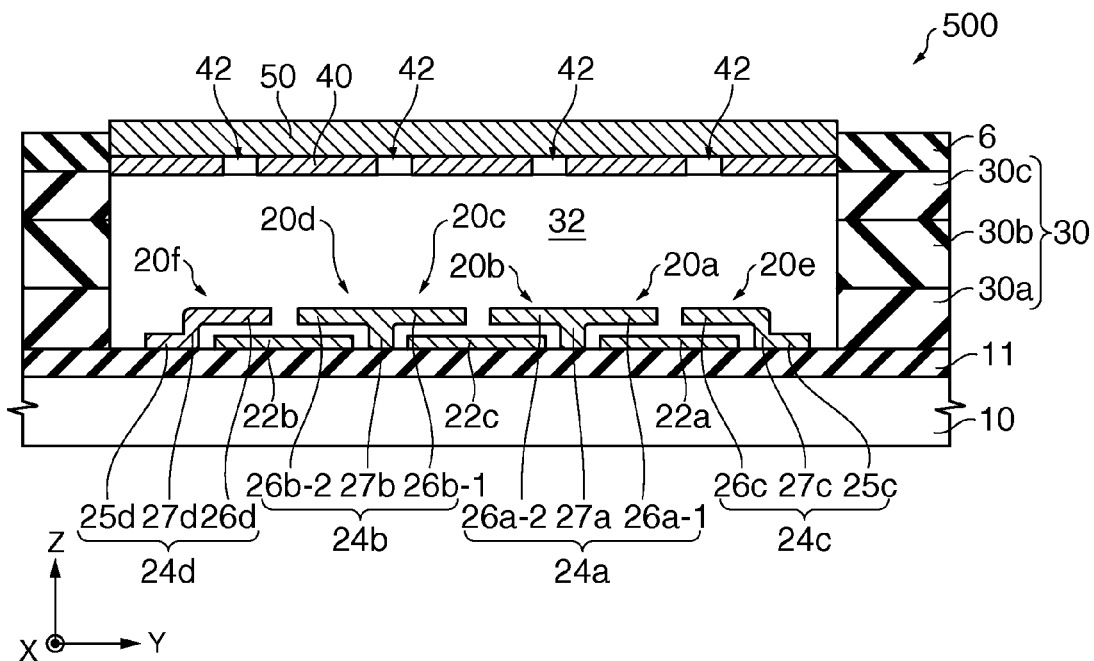
FIG. 11 is a cross-sectional view schematically showing a MEMS device according to a third embodiment.
Figure 12:
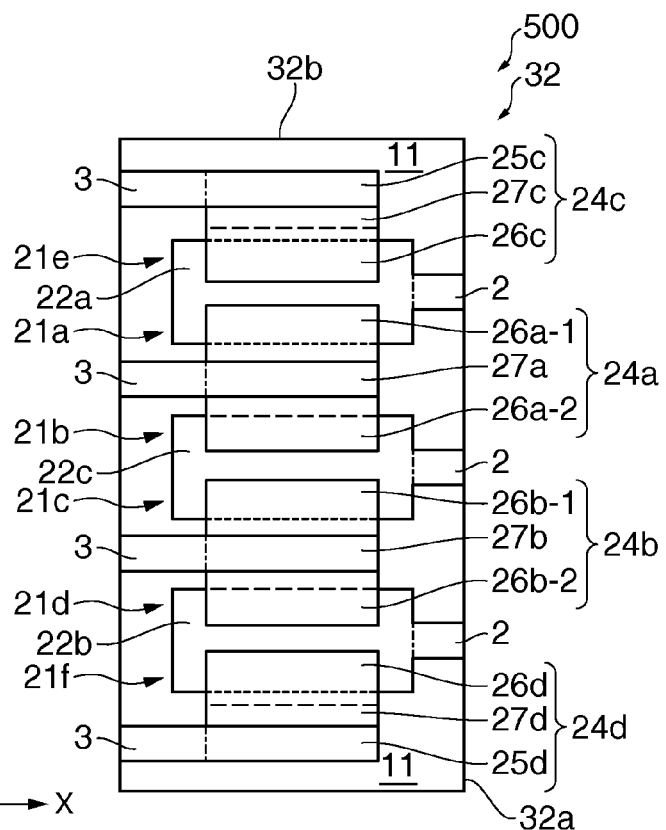
FIG. 12 is a plan view schematically showing the interior of a cavity of the MEMS device according to the third embodiment.

Next, a MEMS device 500 according to a third embodiment will be described with reference to the drawings. FIG. 11 is a cross-sectional view schematically showing the MEMS device 500. FIG. 12 is a plan view schematically showing the interior of the cavity 32 of the MEMS device 500 shown in FIG. 11. In the MEMS device 500 according to the third embodiment, members having the same functions as those of the MEMS devices 100 and 400 according to the first and second embodiments are denoted by the same reference numerals and signs, and the detailed descriptions thereof are omitted.

As shown in FIGS. 11 and 12, the MEMS device 500 includes the substrate 10, a first electrode (hereinafter referred to as a first fixed electrode in the embodiment) 22a, a second electrode (hereinafter referred to as a second fixed electrode in the embodiment) 22b, a third electrode (hereinafter referred to as a third fixed electrode in the embodiment) 22c, a fourth electrode (hereinafter referred to as a first movable electrode in the embodiment) 24a, a fifth electrode (hereinafter referred to as a second movable electrode in the embodiment) 24b, and the inter-layer insulating layer 30. The MEMS device 500 can further include a third movable electrode 24c, a fourth movable electrode 24d, the first coated layer 40, and the second coated layer 50.

The first fixed electrode 22a, the second fixed electrode 22b, and the third fixed electrode 22c are formed on the under layer 11 (above the substrate 10). The first to third fixed electrodes 22a, 22b, and 22c are aligned in the Y-direction as shown in FIGS. 11 and 12. In the illustrated example, the third fixed electrode 22c is formed between the first fixed electrode 22a and the second fixed electrode 22b. In FIGS. 11 and 12, the Y-direction is a direction along the first side 32a of the cavity 32, while the X-direction is a direction along the second side 32b of the cavity 32. The first to third fixed electrodes 22a, 22b, and 22c are formed apart from each other.

The first movable electrode 24a is composed of the first supporting portion 27a formed between the first fixed electrode 22a and the third fixed electrode 22c on the under layer 11, a first beam portion 26a-1 extended from the first supporting portion 27a to face the first fixed electrode 22a, and a second beam portion 26a-2 extended from the first supporting portion 27a to face a part of the third fixed electrode 22c. In the illustrated example, the first beam portion 26a-1 extends from the first supporting portion 27a in the +Y-direction, and the second beam portion 26a-2 extends from the first supporting portion 27a in the −Y-direction. That is, the first beam portion 26a-1 and the second beam portion 26a-2 extend from the first supporting portion 27a in opposite directions.

The second movable electrode 24b is composed of the second supporting portion 27b formed between the second fixed electrode 22b and the third fixed electrode 22c on the under layer 11, a third beam portion 26b-1 extended from the second supporting portion 27b to face a part of the third fixed electrode 22c, and a fourth beam portion 26b-2 extended from the second supporting portion 27b to face the second fixed electrode 22b. In the illustrated example, the third beam portion 26b-1 extends from the second supporting portion 27b in the +Y-direction, and the fourth beam portion 26b-2 extends from the second supporting portion 27b in the −Y-direction. That is, the third beam portion 26b-1 and the fourth beam portion 26b-2 extend from the second supporting portion 27b in opposite directions.

The third movable electrode 24c is composed of a third supporting portion 27c formed on the under layer 11, a fifth beam portion 26c extending from the third supporting portion 27c to face the first fixed electrode 22a, and a fixed portion 25c formed on the under layer 11 and being continuous with the third supporting portion 27c. The fifth beam portion 26c extends from the third supporting portion 27c in the −Y-direction in the illustrated example.

The fourth movable electrode 24d is composed of a fourth supporting portion 27d formed on the under layer 11, a sixth beam portion 26d extending from the fourth supporting portion 27d to face the second fixed electrode 22b, and a fixed portion 25d formed on the under layer 11 and being continuous with the fourth supporting portion 27d. The sixth beam portion 26d extends from the fourth supporting portion 27d in the +Y-direction in the illustrated example.

The fixed electrodes 22a, 22b, and 22c, and the movable electrodes 24a, 24b, 24c, and 24d are contained within the cavity 32. The third supporting portion 27c of the third movable electrode 24c, the first fixed electrode 22a, the first supporting portion 27a of the first movable electrode 24a, the third fixed electrode 22c, the second supporting portion 27b of the second movable electrode 24b, the second fixed electrode 22b, and the fourth supporting portion 27d of the fourth movable electrode 24d are formed on the under layer 11 within the cavity 32 so as to be aligned in this order in the −Y-direction in plan view.

Figure 13:
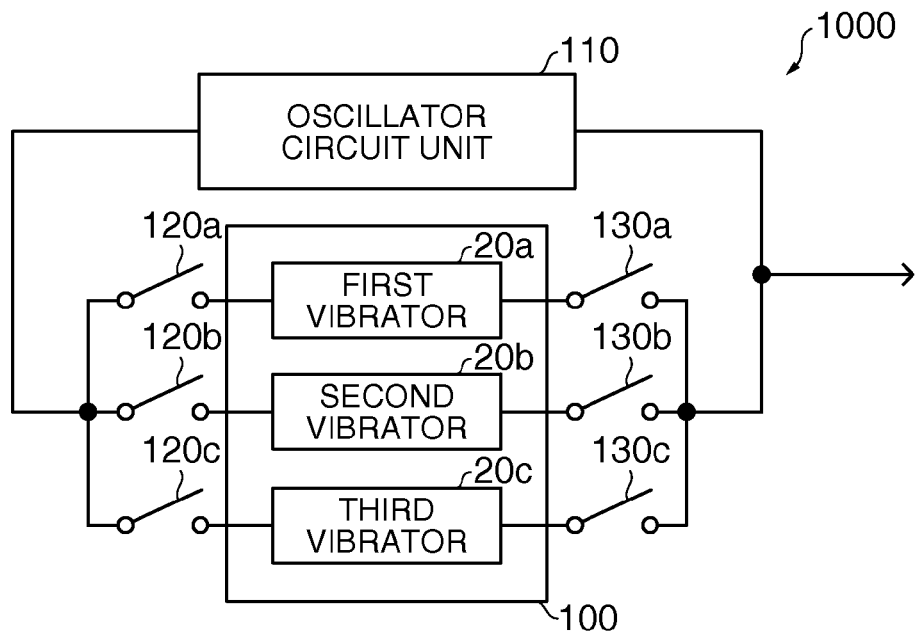
FIG. 13 is a block diagram schematically showing an oscillator according to a fourth embodiment.

Each of the first to third fixed electrodes 22a, 22b, and 22c is electrically connected with the wire 2 within the cavity 32, for example, as shown in FIG. 12, and is electrically connected through the wire 2 with an external oscillator circuit unit (for example, the oscillator circuit unit 110 shown in FIG. 13). Moreover, each of the first to fourth movable electrodes 24a, 24b, 24c, and 24d is electrically connected with the wire 3 within the cavity 32, for example, and is electrically connected through the wire 3 with the external oscillator circuit unit.

In the MEMS device 500, the first fixed electrode 22a and the first beam portion 26a-1 constitute the first vibrator 20a. The third fixed electrode 22c and the second beam portion 26a-2 constitute the second vibrator 20b. The third fixed electrode 22c and the third beam portion 26b-1 constitute the third vibrator 20c. The second fixed electrode 22b and the fourth beam portion 26b-2 constitute the fourth vibrator 20d. The first fixed electrode 22a and the third movable electrode 24c constitute the fifth vibrator 20e. The second fixed electrode 22b and the fourth movable electrode 24d constitute the sixth vibrator 20f. The first to sixth vibrators 20a, 20b, 20c, 20d, 20e, and 20f can have natural frequencies different from one another. For example, the first to sixth vibrators 20a, 20b, 20c, 20d, 20e, and 20f have the beam portions 26a-1, 26a-2, 26b-1, 26b-2, 26c, and 26d different in shape from one another, thereby being capable of having natural frequencies different from one another.

According to the MEMS device 500, the plurality of vibrators 20a, 20b, 20c, 20d, 20e, and 20f can be contained in one cavity 32. Accordingly, the MEMS device 500 can provide a similar advantageous effect to that of the MEMS device 100.

4. Fourth Embodiment 4.1. Oscillator

Next, an oscillator 1000 according to a fourth embodiment will be described with reference to the drawing. The oscillator 1000 has the MEMS device according to any of the embodiments of the invention. In this case, an example of using the MEMS device 100 as the MEMS device according to any of the embodiments of the invention will be described. FIG. 13 is a block diagram schematically showing the oscillator 1000.

As shown in FIG. 13, the oscillator 1000 can include the MEMS device 100, the oscillator circuit unit 110, and switches 120a, 120b, 120c, 130a, 130b, and 130c.

The oscillator circuit unit 110 has circuit elements such as transistors or capacitors, for example. The oscillator circuit unit 110 is a feedback amplifier circuit for operating the vibrators 20a, 20b, and 20c, for example.

One of the electrodes (for example, the fixed electrode 22 shown in FIG. 1) of the first vibrator 20a can be electrically connected to the oscillator circuit unit 110 through the switch 120a, and the other electrode (for example, the movable electrode 24 shown in FIG. 1) of the first vibrator 20a can be electrically connected to the oscillator circuit unit 110 through the switch 130a. One of the electrodes of the second vibrator 20b can be electrically connected to the oscillator circuit unit 110 through the switch 120b, and the other electrode of the second vibrator 20b can be electrically connected to the oscillator circuit unit 110 through the switch 130b. One of the electrodes of the third vibrator 20c can be electrically connected to the oscillator circuit unit 110 through the switch 120c, and the other electrode of the third vibrator 20c can be electrically connected to the oscillator circuit unit 110 through the switch 130c.

The first to third vibrators 20a, 20b, and 20c can have natural frequencies different from one another. In the oscillator 1000, the switches 120a, 120b, 120c, 130a, 130b, and 130c are controlled, so that one of the first to third vibrators 20a, 20b, and 20c can be selected. The selected vibrator and the oscillator circuit unit 110 constitute an oscillator circuit having a resonant frequency according to a natural frequency of the selected vibrator. Although the MEMS device 100 has the three vibrators 20a, 20b, and 20c in the illustrated example, the number of vibrators is not especially limited thereto.

As the switches 120a, 120b, 120c, 130a, 130b, and 130c, analog switches, MEMS switches, or the like can be used, for example. Although the switches 120a, 120b, 120c, 130a, 130b, and 130c are used in the illustrated example, any element can be used without limitation as long as the element can make a selection from the vibrators 20a, 20b, and 20c. For example, a fuse (not illustrated) may be used.

In the oscillator 1000, for example, the first to third vibrators 20a, 20b, and 20c whose beam portion 26 is varied in length L (refer to FIGS. 1 and 2) in a stepwise fashion around a design value of the length L at which a desired resonant frequency is obtained are formed, and a vibrator from which a resonant frequency closest to the desired resonant frequency is obtained is selected from the first to third vibrators 20a, 20b, and 20c, whereby an oscillator circuit can be formed. Moreover, for example, the first to third vibrators 20a, 20b, and 20c are formed so as to have the beam portion 26 with the length L of a design value at which the desired resonant frequency is obtained, and a vibrator from which a resonant frequency closest to the desired resonant frequency is obtained is selected from the first to third vibrators 20a, 20b, and 20c, whereby an oscillator circuit can be formed. According to the oscillator 1000, therefore, an oscillator having a desired resonant frequency can be obtained at high yield. Although the case where the length L of the beam portion 26 is varied has been described herein, an oscillator can be formed in the same manner also by varying the film thickness T (refer to FIG. 1) of the beam portion 26.

4.2. Modified Examples

Next, oscillators according to modified examples of the embodiment will be described with reference to the drawings. Hereinafter, in the oscillators according to the modified examples of the embodiment, members having the same functions as those of the constituent members of the oscillator 1000 are denoted by the same reference numerals and signs, and the detailed descriptions thereof are omitted.

4.2.1. First Modified Example

Figure 14:
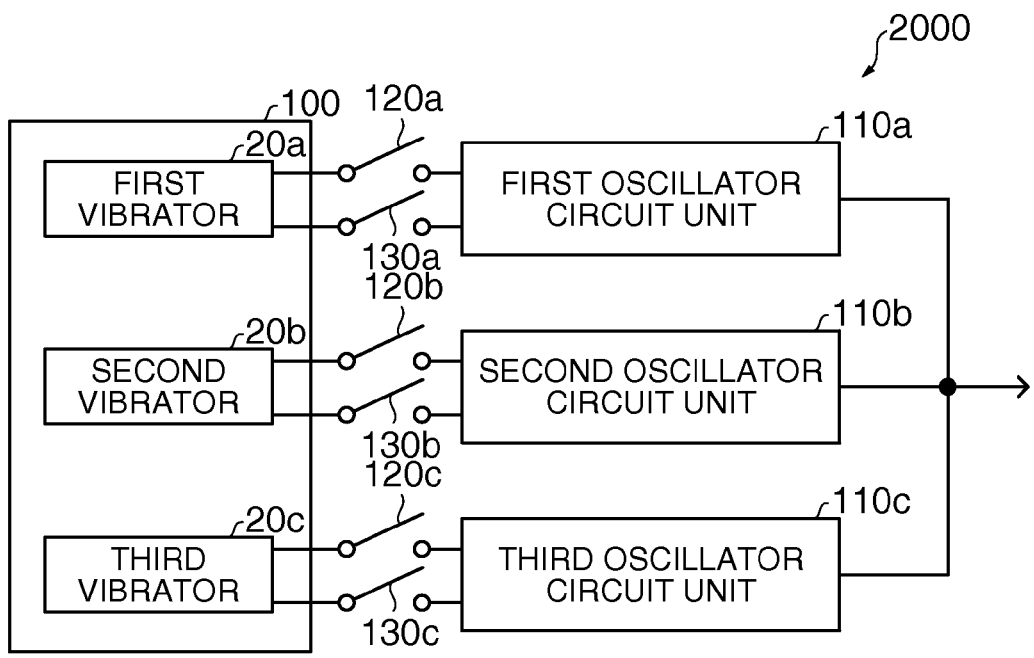
FIG. 14 is a block diagram schematically showing an oscillator according to a first modified example of the fourth embodiment.

An oscillator 2000 according to a first modified example will be first described. FIG. 14 is a block diagram schematically showing the oscillator 2000.

In the example of the oscillator 1000, one oscillator circuit unit 110 is included with respect to the first to third vibrators 20a, 20b, and 20c. On the other hand, the oscillator 2000 can include oscillator circuit units 110a, 110b, and 110c with respect to the first to third vibrators 20a, 20b, and 20c, respectively.

As shown in FIG. 14, one of the electrodes (for example, the fixed electrode 22 shown in FIG. 1) of the first vibrator 20a can be electrically connected to the first oscillator circuit unit 110a through the switch 120a, and the other electrode (for example, the movable electrode 24 shown in FIG. 1) of the first vibrator 20a can be electrically connected to the first oscillator circuit unit 110a through the switch 130a. One of the electrodes of the second vibrator 20b can be electrically connected to the second oscillator circuit unit 110b through the switch 120b, and the other electrode of the second vibrator 20b can be electrically connected to the second oscillator circuit unit 110b through the switch 130b. One of the electrodes of the third vibrator 20c can be electrically connected to the third oscillator circuit unit 110c through the switch 120c, and the other electrode of the third vibrator 20c can be electrically connected to the third oscillator circuit unit 110c through the switch 130c. In the oscillator 2000, the switches 120a, 120b, 120c, 130a, 130b, and 130c are controlled, so that one of the first to third vibrators 20a, 20b, and 20c can be selected. The selected vibrator and the corresponding oscillator circuit unit constitute an oscillator circuit having a resonant frequency according to a natural frequency of the selected vibrator.

In the oscillator 2000, since the first to third vibrators 20a, 20b, and 20c having natural frequencies different from one another can be selected for use, three frequency signals can be output from one oscillator.

The oscillator 2000 includes one oscillator circuit unit with respect to one vibrator. Accordingly, even when the difference in the natural frequency of the vibrators 20a, 20b, and 20c is great, specifically, even when, for example, the difference in the natural frequency of the vibrators 20a, 20b, and 20c is from 50 to 100 MHz, an oscillator circuit according to each of the vibrators can be formed.

4.2.2. Second Modified Example

Figure 15:
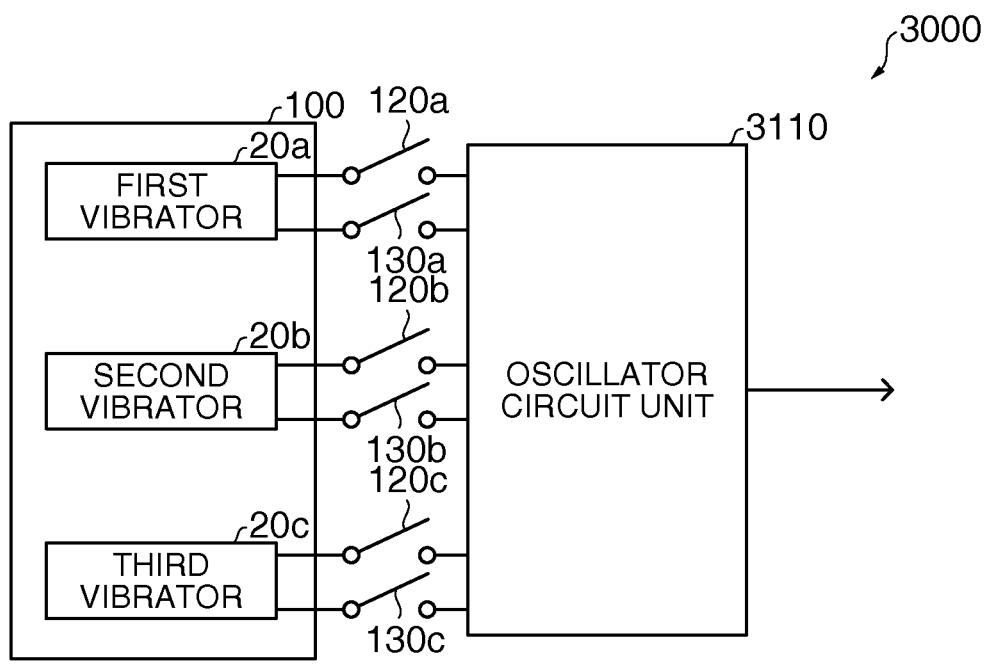
FIG. 15 is a block diagram schematically showing an oscillator according to a second modified example of the fourth embodiment.

Next, an oscillator 3000 according to a second modified example will be described. FIG. 15 is a block diagram schematically showing the oscillator 3000. Hereinafter, in the oscillator 3000, members having the same functions as those of the constituent members of the oscillator 2000 are denoted by the same reference numerals and signs, and the descriptions thereof are omitted.

In the example of the oscillator 2000, the oscillator circuit units 110a, 110b, and 110c are included with respect to the first to third vibrators 20a, 20b, and 20c, respectively. On the other hand, the oscillator 3000 can include one oscillator circuit unit 3110 with respect to the first to third vibrators 20a, 20b, and 20c. With this configuration, compared to the oscillator 2000, the oscillator 3000 can achieve miniaturization of the device or simplification of routing of wires because the oscillator 3000 has to include only one oscillator circuit unit.

In the oscillator 3000, the difference in the natural frequency of the vibrators 20a, 20b, and 20c is desirably small. Specifically, for example, the difference in the natural frequency of the vibrators 20a, 20b, and 20c is desirably less than 50 MHz.

According to the oscillator 3000, similarly to the oscillator 2000, since the first to third vibrators 20a, 20b, and 20c having natural frequencies different from one another can be selected for use, three frequency signals can be output from one oscillator.

The oscillator 3000 can achieve miniaturization of the device or simplification of routing of wires because the oscillator 3000 has to include only one oscillator circuit unit.

The embodiments and modified examples are illustrative only, and the invention is not limited thereto. For example, it is also possible to combine the embodiments and modified examples appropriately.

The embodiments of the invention have been described in detail. However, those skilled in the art should readily understand that many modifications can be made without departing in substance from the novel matter and effects of the invention. Accordingly, all of those modified examples are deemed to be included in the scope of the invention.

The entire disclosure of Japanese Patent Application No. 2010-055489, filed Mar. 12, 2010 is expressly incorporated by reference herein.

What is claimed is:

1. A micro electro mechanical system (MEMS) device comprising:
   a substrate;
   an under layer that is formed above the substrate;
   an insulating layer that is formed above the under layer;
   a first coated layer that is formed above the insulating layer, the first coated layer having a plurality of through holes;
   a second coated layer that is formed on the first coated layer;
   a cavity defined by the under layer at a bottom of the cavity, the insulating layer at a side of the cavity, and the coated layer at a top of the cavity;
   a first vibrator that is provided inside the cavity and that has a first natural frequency; and
   a second vibrator that is provided inside the cavity and that has a second natural frequency that is different from the first natural frequency, wherein
   the second coated layer covers the plurality of through holes, and
   the first vibrator and the second vibrator share a common electrode.

2. The MEMS device according to claim 1, wherein
   the cavity has a rectangular shape including a first side and a second side, the second side being shorter than the first side, and
   the first vibrator and the second vibrator are arranged along the first side.

3. The MEMS device according to claim 1, further comprising a third vibrator that is provided inside the cavity, wherein the first vibrator and the second vibrator are arranged on a first line parallel to a first side of the cavity, and the third vibrator is arranged at a position that is located on a second line that is perpendicular to the first line and that crosses the first line between the first vibrator and the second vibrator, and the position is located on a third line parallel to the first line.

4. A micro electro mechanical system (MEMS) device comprising:
   a substrate;
   an under layer that is formed above the substrate;
   an insulating layer that is formed above the under layer;
   a coated layer that is formed above the insulating layer;
   a cavity defined by the under layer at a bottom of the cavity, the insulating layer at a side of the cavity, and the coated layer at a top of the cavity;
   a first electrode provided inside the cavity;
   a second electrode provided inside the cavity and having a first supporting portion and a first beam portion extending from the first supporting portion in a first direction to face a part of the first electrode; and
   a third electrode provided inside the cavity and having a second supporting portion and a second beam portion extending from the second supporting portion in a second direction opposite to the first direction to face a part of the first electrode, wherein
   the first electrode and the second electrode form a first vibrator having a first natural frequency, and
   the first electrode and the third electrode form a second vibrator having a second natural frequency different from the first natural frequency.

5. A micro electro mechanical system (MEMS) device comprising:
   a substrate;
   an under layer that is formed above the substrate;
   an insulating layer that is formed above the under layer;
   a coated layer that is formed above the insulating layer;
   a cavity defined by the under layer at a bottom of the cavity, the insulating layer at a side of the cavity, and the coated layer at a top of the cavity;
   a first electrode provided inside the cavity;
   a second electrode provided inside the cavity;
   a third electrode provided inside the cavity and formed between the first electrode and the second electrode;
   a fourth electrode provided inside the cavity and having a first supporting portion formed between the first electrode and the third electrode, a first beam portion extended from the first supporting portion to face the first electrode, and a second beam portion extended from the first supporting portion to face a part of the third electrode; and
   a fifth electrode provided inside the cavity and having a second supporting portion formed between the second electrode and the third electrode, a third beam portion extended from the second supporting portion to face a part of the third electrode, and a fourth beam portion extended from the second supporting portion to face the second electrode, wherein
   the first electrode and the first beam portion form a first vibrator,
   the third electrode and the second beam portion form a second vibrator,
   the third electrode and the third beam portion form a third vibrator,
   the second electrode and the fourth beam portion form a fourth vibrator, and
   natural frequencies of the first through fourth vibrators are different from one another.

6. The MEMS device according to claim 1, wherein the insulating layer is formed of a plurality of inter-layer insulating layers.

7. The MEMS device according to claim 1, wherein a guard ring surrounding the first and second vibrators from the side is formed above the substrate.

8. The MEMS device according to claim 7, wherein the guard ring is formed of a conductive material.

9. The MEMS device according to claim 4, wherein a guard ring surrounding the first and second vibrators from the side is formed above the substrate.

10. The MEMS device according to claim 5, wherein a guard ring surrounding the first through fourth vibrators from the side is formed above the substrate.

11. An oscillator comprising the MEMS device according to claim 1.

12. The oscillator according to claim 11, further comprising:
    an oscillator circuit unit; and
    a switch selecting one of the first and second vibrators included in the MEMS device to electrically connect the one of the first and second vibrators with the oscillator circuit unit.

13. An oscillator comprising the MEMS device according to claim 4.

14. The oscillator according to claim 13, further comprising:
    an oscillator circuit unit; and
    a switch selecting one of the first and second vibrators included in the MEMS device to electrically connect the one of the first and second vibrators with the oscillator circuit unit.

15. An oscillator comprising the MEMS device according to claim 5.

16. The oscillator according to claim 15, further comprising:
    an oscillator circuit unit; and
    a switch selecting one of the first through fourth vibrators included in the MEMS device to electrically connect the one of the first through fourth vibrators with the oscillator circuit unit.

* * * * *